United States Patent [19]

Schnable et al.

[11] 4,249,960

[45] Feb. 10, 1981

[54] LASER ROUNDING A SHARP SEMICONDUCTOR PROJECTION

[75] Inventors: George L. Schnable, Lansdale, Pa.; Chung P. Wu, Mercerville, N.J.

[73] Assignee: RCA Corporation, New York, N.Y.

[21] Appl. No.: 49,597

[22] Filed: Jun. 18, 1979

[51] Int. Cl.³ .................. H01L 21/263; H01L 21/268
[52] U.S. Cl. ................................. 148/1.5; 219/121 L; 357/91; 427/53.1
[58] Field of Search .......................... 148/1.5; 357/91; 219/121 L; 427/53.1; 252/62.3 R

[56] References Cited

U.S. PATENT DOCUMENTS

| | | | |
|---|---|---|---|
| 3,404,253 | 10/1968 | Anderson et al. | 219/121 |
| 4,004,949 | 1/1977 | Lesk | 148/1.5 |
| 4,059,461 | 11/1977 | Fan et al. | 148/1.5 |
| 4,113,516 | 9/1978 | Ponczak et al. | 148/1.5 |

OTHER PUBLICATIONS

Fan et al., "Crystallization . . . Laser Heating" Appl. Phys. Letts. 27, (1975) 224.
Andrew et al., "Fast Crystallization . . . Ge Films" J. Appl. Phys. 50, (Feb. 1979) 1142.
Hofker et al., "Laser Irradiation . . . Dislocations" Appl. Phys. Letts. 34, (May 1979) 690.
Wu et al., "Pulsed Laser Annealing . . . " Appl. Phys. Letts. 34, (Jun. 1, 1979) 737.
Bean et al., "Substrate . . . Laser-induced . . . Si" J. Appl. Phys. 50, (Feb. 1979) 881.
Bertolotti et al., "Structure Transitions . . . Laser . . . ", J. Appl. Phys. 50, (Jan. 1979) 259.
Baeri et al., "A Melting Model . . . Laser Annealing . . . " J. Appl. Phys. 50, (Feb. 1979) 788.
Hutchins, "Localized. .. Diffusions . . . Laser Melting . . . " IBM-TDB, 16 (1974), 2585.
"Laser Annealing . . . PN Junctions" Physics Today, (Jul. 1978), p. 17-20.
"Laser Annealing:Processing S/C Without Furnace" Science, vol. 201 (Jul. 1978), p. 333.

*Primary Examiner*—L. Dewayne Rutledge
*Assistant Examiner*—Upendra Roy
*Attorney, Agent, or Firm*—Birgit E. Morris; Donald S. Cohen; Thomas H. Magee

[57] ABSTRACT

A method of rounding a sharp semiconductor projection jutting out from a principal body of semiconductor material comprises the step of irradiating the projection with a laser pulse having an energy density of less than about 1.5 joules/cm².

8 Claims, 8 Drawing Figures

LASER ROUNDING A SHARP SEMICONDUCTOR PROJECTION

This invention relates to a method of rounding a sharp semiconductor projection jutting out from a principal body of semiconductor material.

In manufacturing semiconductor devices, bodies of semiconductor material may have relatively sharp projections jutting out therefrom resulting from various processing steps. For example, epitaxially deposited layers of silicon generally have rougher surfaces than the surfaces of polished silicon wafers. Such epitaxial layers of silicon, whether deposited on similar (homoepitaxial) or dissimilar (heteroepitaxial) material, such as sapphire, often have epitaxial spikes or hillocks protruding from portions of the surfaces. Such sharp projections reduce the yield and reliability of devices fabricated thereon, especially in larger scale integrated circuit (IC) devices having highly dense circuitry.

In other embodiments, the sharp projections may comprise the edges or corners of a semiconductor island disposed on an insulating substrate. For example, in fabricating silicon-on-sapphire (SOS) semiconductor devices, layers of silicon, epitaxially deposited on sapphire substrates, are anisotropically etched to form silicon islands. Sharp edges are formed where the (100) top planar surfaces intersect the (111) side planar surfaces of the islands, and also at the corners where the (111) side planar surfaces intersect each other. The thermally grown silicon dioxide over these specific locations is especially susceptible to localized dielectric breakdown. In particular, both yield and reliability data indicate that the integrity of the thermally grown oxide between polycrystalline silicon gate areas and the underlying islands of single-crystal silicon is not always as good as might be desired. The present invention comprises an annealing technique useful for rounding these sharp semiconductor projections during semiconductor manufacturing.

Figure 1:
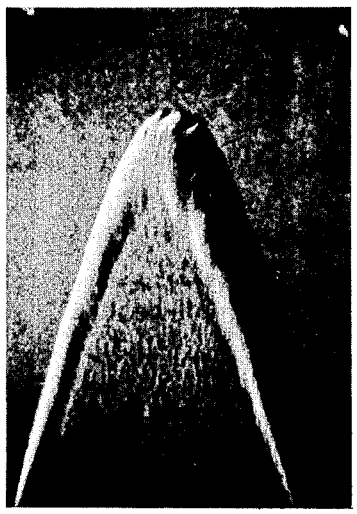
FIG. 1 is a photomicrograph at 10K magnification showing part of a typical silicon island disposed on a sapphire substrate prior to being laser annealed in accordance with the method of the present invention.

In accordance with the novel method of the present invention, a sharp semiconductor projection on a principal body of semiconductor material is irradiated with a laser pulse having an energy density of less than about 1.5 joules/cm$^2$. Referring to FIG. 1 of the drawings, there is shown part of a typical silicon-on-sapphire (SOS) island after being defined, usually by using standard photolithographic techniques followed by anisotropic etching. Sharp edges are present where the top surface, typically the (100) plane, intersects the side surface, typically the (111) plane. According to the present invention, we irradiated the sharp edges with a laser pulse having an energy density of less than about one joule/cm$^2$. In the present embodiment, we utilized a Q-switched ruby laser having a wavelength of 0.69 $\mu$m and a pulse duration time of about 30 nanoseconds. The pulse duration time may vary but is preferably between about 10 and about 50 nanoseconds.

Figure 3:
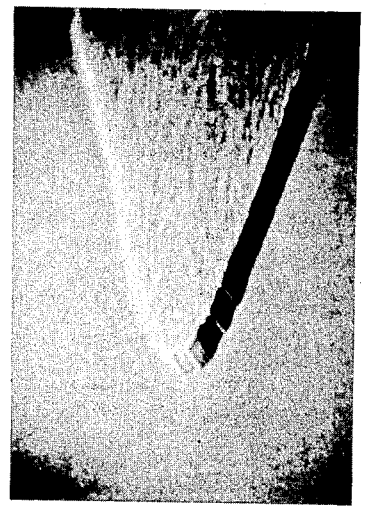
FIGS. 2, 3 and 4 are photomicrographs at 10K magnification showing a silicon island as illustrated in FIG. 1 after being subjected to the laser annealing method of the present invention at ruby laser power densities of 7.5, 15 and 20 MW/cm$^2$, respectively.
Figure 4:
Figure 2:
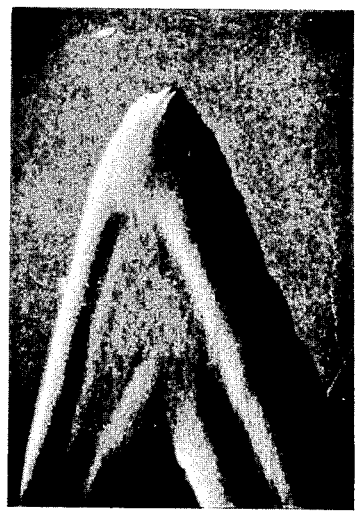

We irradiated three SOS samples having defined islands with the ruby laser at power densities of 7.5, 15 and 20 MW/cm$^2$, respectively. Such power densities are equivalent to a 30 nanosecond laser pulse having energy densities of about 0.23, 0.45 and 0.6 joule/cm$^2$, respectively. The results are illustrated in FIGS. 2, 3 and 4, respectively, which are photomicrographs made using a scanning electron microscope (SEM). FIG. 2 shows that the edges of the silicon islands begin to melt and form rounded edges at approximately 7.5 MW/cm$^2$. At 15 MW/cm$^2$ (FIG. 3), the melting is more noticable, while at 20 MW/cm$^2$ (FIG. 4), the melting is quite pronounced. From these results, we observed that the surface of the silicon islands melted and refroze to a more smooth surface, which would be beneficial in subsequent processing steps such as photolithography, and would result in less pinholes in a thermally-grown oxide thereon. We irradiated other SOS samples at higher power densities. However, we observed that above 25 MW/cm$^2$ ruby laser power density, the silicon island surface started to develop undesirable pits.

Figure 5:
FIGS. 5 and 6 are photomicrographs at 10K magnification showing part of a defined polycrystalline silicon island over an oxide layer disposed on a silicon substrate before and, respectively, after being subjected to laser annealing using a ruby laser power density of 15 MW/cm$^2$.
Figure 6:
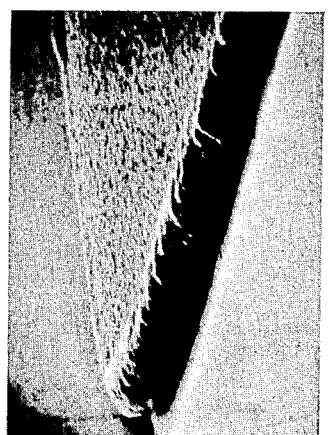

Referring to FIGS. 5 and 6, we demonstrate that the present method can be utilized to round the sharp edges of polycrystalline silicon. FIG. 5 shows part of a defined polycrystalline silicon island over a silicon dioxide layer disposed on a silicon wafer. After subjecting the sharp polycrystalline silicon edges to ruby laser irradiation having a power density of 15 MW/cm$^2$, the edges become rounded, as illustrated in FIG. 6.

Figure 7:
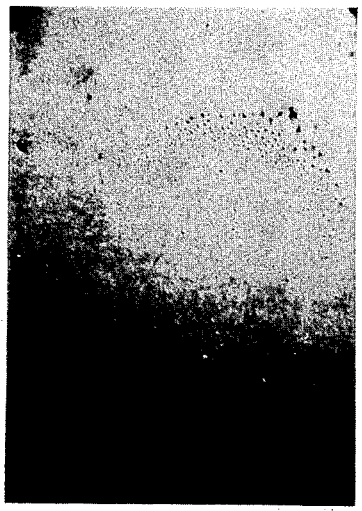
FIG. 7 is a photomicrograph at 500 magnification showing part of the surface of an epitaxially deposited silicon layer having epitaxial spikes protruding from a portion thereof.
Figure 8:
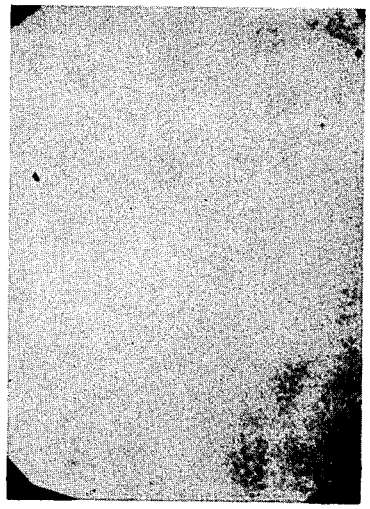
FIG. 8 is a photomicrograph at 500 magnification showing the epitaxial surface illustrated in FIG. 7 after being subjected to laser annealing using a ruby laser power density of 20 MW/cm$^2$.

Referring to FIG. 7, there is shown part of a semiconductor surface having epitaxial spikes, known as hillocks to those skilled in the art, protruding from various portions of the surface. In the present embodiment, this semiconductor surface comprises a surface of an epitaxially deposited layer of silicon on a wafer. In accordance with the method of the present invention, this surface was irradiated with a ruby laser pulse having a pulse density of about 20 MW/cm$^2$. FIG. 8 shows that such irradiation has removed the surface roughness by effectively melting the hillocks into a smoother epitaxial layer. Furthermore, we have found that the epitaxially deposited wafer may be tilted at an angle so that the laser beam strikes the sharp projections at an angle acute to the plane of the epitaxial surface. This maximizes the laser power absorption by the epitaxial spikes and minimizes any possible deleterious effects to interfaces lying below the epitaxial surface, such as the silicon-sapphire interface in SOS wafers.

Lasers emitting shorter wavelengths are expected to achieve the same results with slightly lower pulse power densities. Lasers with longer wavelengths, such as a Nd:glass laser, require slightly higher pulse power densities. However, lasers emitting at longer wavelengths might do additional damage to underlying interfaces, such as the silicon-sapphire interface.

The unexpectedly small amount of laser pulse energy required for rounding these sharp semiconductor projections may be explained by the fact that the laser energy absorbed by such sharp projections is confined to a relatively small mass which prevents the heat generated therein from rapidly diffusing away via conduction, thereby causing the projections to melt and refreeze. The discovery that laser irradiation at an energy pulse density of less than about 1.5 joules/cm$^2$, or equivalently 50 MW/cm$^2$, is effective to round sharp semiconductor projections is very important commercially. It makes such a procedure very attractive economically since the entire wafer can be quickly laser annealed with a single pulse. Such an economical and fast throughput of semiconductor wafers costs little more in additional processing expense, but can provide significant savings in achieving higher yield and reliability, especially in the manufacture of higher-density integrated circuit devices.

What is claimed is:

1. A method of rounding a sharp semiconductor projection on a principal body of semiconductor material comprising the step of irradiating said projection with a laser pulse having an energy density of less than about 1.5 joules/cm$^2$.

2. A method as recited in claim 1 wherein said sharp semiconductor projection comprises a spike or hillock protruding from a surface of said semiconductor body.

3. A method as recited in claim 2 wherein said laser beam strikes said projection at an angle acute to the plane of said semiconductor surface.

4. A method as recited in claim 3 wherein said semiconductor surface comprises a surface of an epitaxially deposited layer of silicon.

5. A method as recited in claim 1 wherein said sharp semiconductor projection comprises an edge or corner of a semiconductor island disposed on an insulating substrate.

6. A method as recited in claim 5 wherein said semiconductor island comprises silicon and wherein said insulating substrate comprises sapphire.

7. A method as recited in claim 1 wherein said laser pulse has a pulse duration time of between about 10 and about 50 nanoseconds.

8. A method as recited in claim 7 wherein said laser is a Q-switched ruby laser having a pulse energy density of between about 0.2 and 0.8 joule/cm$^2$, and a pulse duration time of about 30 nanoseconds.

* * * * *